(12) United States Patent
Keser et al.

(10) Patent No.: US 6,974,775 B2
(45) Date of Patent: Dec. 13, 2005

(54) METHOD AND APPARATUS FOR MAKING AN IMPRINTED CONDUCTIVE CIRCUIT USING SEMI-ADDITIVE PLATING

(75) Inventors: Milan Keser, Chandler, AZ (US); Boyd L. Coomer, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,196

(22) Filed: Dec. 31, 2002

(65) Prior Publication Data

US 2004/0124533 A1 Jul. 1, 2004

(51) Int. Cl.[7] .......................................... H01L 21/445
(52) U.S. Cl. ...................... 438/675; 438/677; 29/25.01; 425/403; 427/98.8
(58) Field of Search ................................ 438/125, 674, 438/675, 677, 678, 687; 427/98, 98.4, 98.6, 98.8; 29/25.01; 425/425

(56) References Cited

U.S. PATENT DOCUMENTS

| | | | |
|---|---|---|---|
| 4,356,627 A | * 11/1982 | Hoffman ...................... | 29/849 |
| 4,651,417 A | 3/1987 | Schumacher, III et al. | |
| 4,912,844 A | 4/1990 | Parker | |
| 5,043,184 A | 8/1991 | Fujii et al. | |
| 5,091,339 A | 2/1992 | Carey | |
| 5,830,563 A | 11/1998 | Shimoto et al. | |
| 6,005,198 A | 12/1999 | Gregoire | |
| 6,080,656 A | * 6/2000 | Shih et al. ................... | 438/626 |
| 6,127,196 A | 10/2000 | Butera et al. | |
| 6,140,234 A | * 10/2000 | Uzoh et al. .................. | 438/678 |
| 6,156,870 A | 12/2000 | Morita et al. | |
| 6,254,972 B1 | 7/2001 | Farquhar et al. | |
| 6,410,418 B1 | * 6/2002 | Yang .......................... | 438/626 |
| 6,422,528 B1 | * 7/2002 | Domeier et al. ............... | 249/60 |
| 6,482,742 B1 | * 11/2002 | Chou .......................... | 438/690 |
| 6,511,912 B1 | * 1/2003 | Chopra et al. ............... | 438/674 |
| 2003/0135998 A1 | 7/2003 | Walz et al. | |
| 2004/0118594 A1 | 6/2004 | Thomas et al. | |

FOREIGN PATENT DOCUMENTS

WO     WO-01/50825 A1     7/2001

OTHER PUBLICATIONS

"Method to Control the Geometry and Vertical Profile of Via Holes in Substrate Materials", *IBM Technical Disclosure Bulletin, 35,* (Oct. 1, 1992),211–216.

Tormen, M., et al., "Thermocurable Polymers as Resists for Imprint Lithography", *Electronics Letters, 36,* (May 25, 2000),983–984.

* cited by examiner

*Primary Examiner*—Craig A. Thompson
*Assistant Examiner*—Stephen W. Smoot
(74) *Attorney, Agent, or Firm*—Schwegman, Lundberg, Woessner & Kluth, P.A.

(57) ABSTRACT

A method and apparatus for making an imprinted conductive circuit using semi-additive plating. A plurality of indented channels is formed on the substrate. The surface is coated with a conductive layer. Portions of the surface other than the indented channels are coated with a non-conductive layer, and metal is plated on the conductive layer in the channels. The non-conductive layer and the first conductive layer are removed from portions of the surface other than the indented channels. In some embodiments, a first set of channels has a first depth and a second set of channels has a second depth. The plating adds a first amount of metal in the first set of channels and the second set of channels. The first set of channels is coated with a non-conductive layer, and a second amount of additional conductive material is plated in the second set of channels.

15 Claims, 6 Drawing Sheets

METHOD AND APPARATUS FOR MAKING AN IMPRINTED CONDUCTIVE CIRCUIT USING SEMI-ADDITIVE PLATING

FIELD OF THE INVENTION

This invention relates to the field of electronic package fabrication, and more specifically to a method and apparatus of making an imprinted conductive circuit by semi-additive plating.

BACKGROUND OF THE INVENTION

Bare electronic chips typically need to be assembled in a package that provides an electric circuit to each electrical connection of the chip and to an external connector such as a pin or a ball. Typical is a pin-grid array package having relatively large pins on one side for external connections, and pads on an opposite side for connections to a ball-grid-array set of connections to the electronic chip (such as a processor or memory chip). Also typical is a ball-grid array package having relatively large balls with relatively large spacings on one side of the package for external connections, and small closely spaced pads on the opposite side for connections to a similar ball-grid-array set of connections to the electronic chip (such as a processor or memory chip).

Such a package typically has a non-conductive substrate (such as plastic or ceramic) with conductive traces (wires) on or in a surface of the substrate. Balls and/or pins are attached, and one or more electronic chips are attached, for example, by also using ball-grid-array connection methods. Optionally, a cover or encapsulant is used to enclose the chip or chips. Optionally, a heat-removing device or structure is attached to, or pressed against, the chip or chips.

One conventional way to make such a package is to start with a sheet or strip of dielectric coated with a conductive metal such as copper, then using various drilling, plating, lithographic and metal etching steps form a pattern leaving metal where traces are desired, attach one or more chips to the one side of the remaining pattern, attach pins or balls to the other side, and encapsulate the chip or chips. Such a method is difficult to apply to devices requiring substantial signal routing and/or power-supply capability.

Another conventional way to make such a package is to start with a sheet or strip of non-conductive plastic of ceramic, deposit ink in a pattern that forms the conductive traces, sinter the ink to form metal traces, in order to make a printed-circuit card or printed-wiring substrate. This method is difficult and costly.

What is needed is a simple, inexpensive, reliable method and apparatus to fabricate packages for electronic chips.

DESCRIPTION OF PREFERRED EMBODIMENTS

Figure 1A:
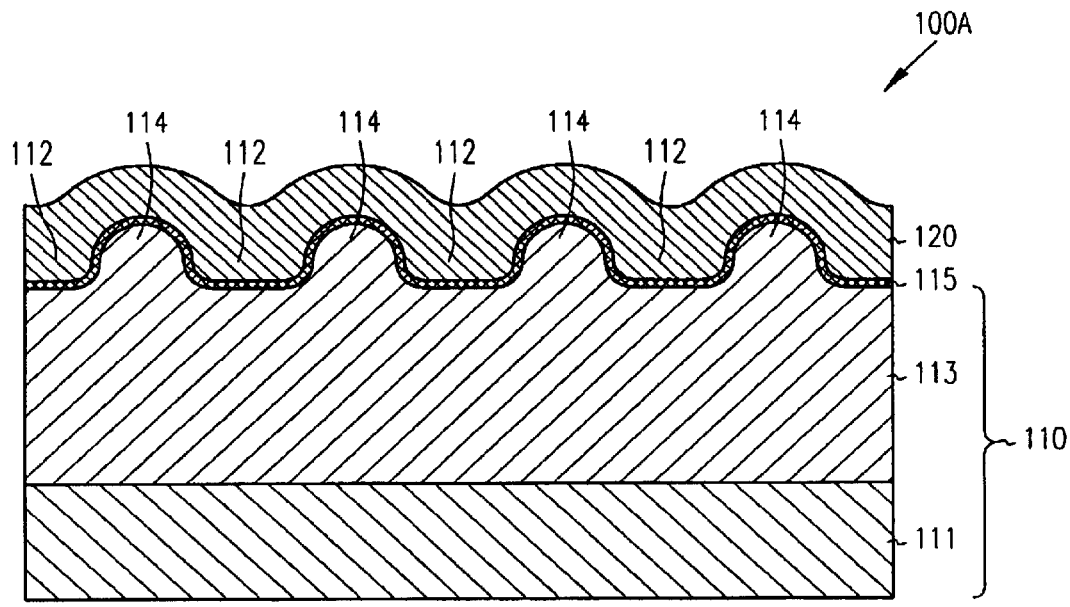
FIG. 1A shows an embossed substrate 110 having a thick plating layer 120

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Substrate 110 (in this case, primarily insulating layer 113) is embossed with a pattern of channels 112 located among raised areas 114.

The terms, chip, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements at least one of which is a metallic element.

Negative photoresist refers to a photoresist that polymerizes when exposed to an appropriate wavelength of light. The polymerized photoresist remains on a substrate during a subsequent process operation, such as an etch operation. Positive photoresist refers to a photoresist that depolymerizes when exposed to an appropriate wavelength of light. The depolymerized photoresist is washed away as the photoresist is developed.

Resist is a more general term that includes photoresist materials as well as resist materials that are not photosensitive. Resist materials may also be polymerized or hardened by exposure to oxygen, evaporation of a solvent, heating, or other suitable methods, depending on the resist material. Resist is removed from a substrate by an operation typically referred to as resist stripping. In some embodiments, resist stripping is accomplished by wet-chemical processing such as exposure to a suitable solvent. In some instances photoresist is removed (i.e., stripped) by treatment with a plasma in an operation often referred to as ashing.

Substrate generally refers to the physical object that is the basic workpiece that is transformed by various process operations into the desired microelectronic configuration. Substrates may include conducting material (such as copper or aluminum), insulating material (such as ceramic, plastic, or sapphire), semiconducting materials (such as silicon), non-semiconducting, or combinations of semiconducting and non-semiconducting materials. In some embodiments, substrates include layered structures, such as a sheet of material chosen for electrical and/or thermal conductivity (such as copper or copper plated nickel/iron alloys) covered with a layer of plastic chosen for electrical insulation, stability, and embossing characteristics.

The term vertical is defined to mean substantially perpendicular to the major surface of a substrate. Height or depth refer to a distance in a direction perpendicular to the major surface of a substrate.

Figure 2A:
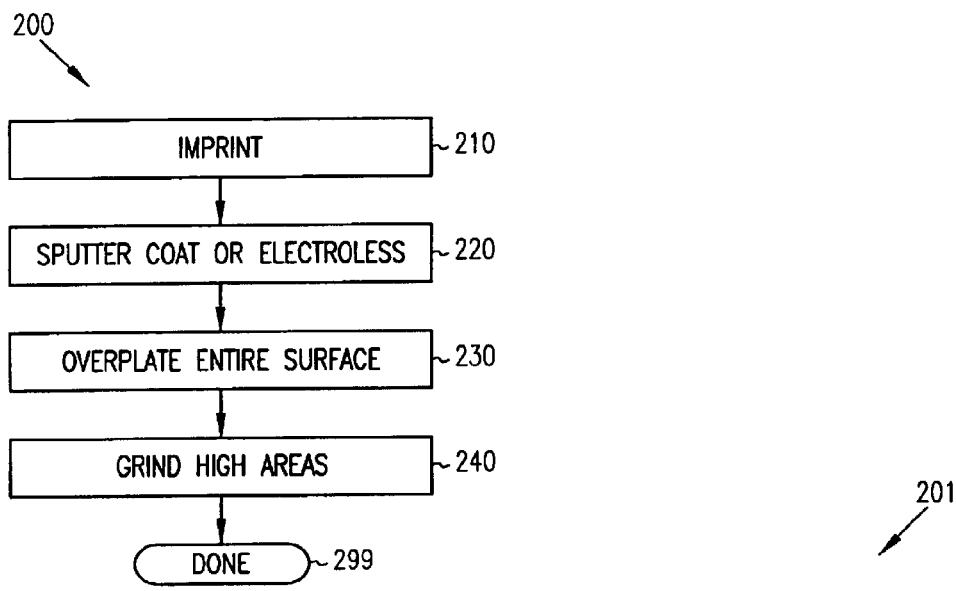
FIG. 2A is a flow chart of method 200.

FIG. 1A shows an embossed substrate 110 that has been processed to have a thick plating layer 120, as would result after operations 210, 220, and 230 of method 200 of FIG. 2A. In some embodiments, substrate 110 is a plastic material. In other embodiments, substrate 110 is any other suitable insulator material, such as ceramic. In still other embodiments such as shown, substrate 110 is an electrically insulating material 113 (such as a thermoplastic polymer plastic material) layer bonded to another material layer 111 (not necessarily shown to scale) such as a copper or aluminum sheet or nickel/iron alloy (for example, used to better conduct heat and/or to provide a ground plane beneath the traces that are to be made, and/or to provide stiffness). In other embodiments, a sapphire wafer or a ceramic sheet is included as at least part of the substrate (e.g., to provide stiffness and/or electrical isolation).

Substrate 110 (in this case, primarily the insulating layer 113) is embossed with a pattern of channels 112 located among raised areas 114. These channels 112 define where the final traces will be. A conductive layer 115, such as sputtered conductor such as copper or nickel or other suitable metal, or an electrolessly deposited layer such as nickel or copper formed by, for example dipping substrate 110 in a bath of a suitable nickel or copper salt. In some embodiments, wet chemical electroplating is then used to plate additional material (such as copper or other suitable metal) to a suitable thickness, thus forming layer 120.

Figure 1B:
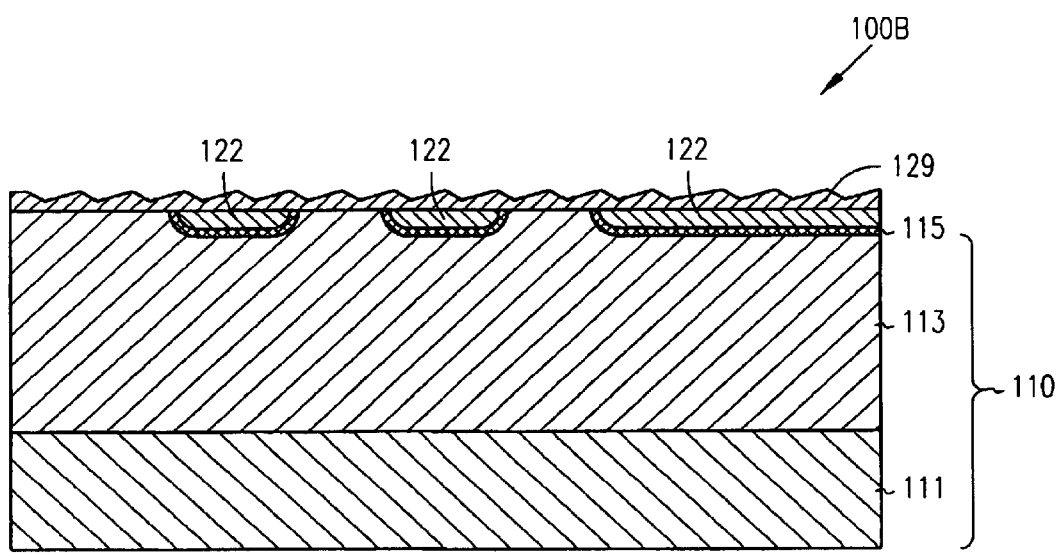
FIG. 1B shows embossed substrate 110 after thick plating layer 120 has been mechanically polished off high areas leaving only the separated traces 122 in channels 112

FIG. 1B shows embossed substrate 110 after thick plating layer 120 has been mechanically polished off high areas leaving only the separated traces 122 in channels 112, as would result after operations 210, 220, 230 and 240 of method 200 of FIG. 2A. Top surface 129 is the result of one or more grinding or polishing steps, and typically exhibits roughness at some scale. The polishing operation removes the high portions of ridges 114 and the metal above those ridges, thus leaving only traces 122, which are electrically isolated by the insulating layer 113 from one another and from layer 111 (in some cases, layer 111 is an electrical conductor).

FIG. 1A shows the overplated imprinted buildup layer, and FIG. 1B shows the side view of copper traces that remain after the grinding step. Note how much copper is ground away (wasted). The process (simplified) is as follows:

1. Imprint into the soft buildup material where the traces are to be created.
2. Sputter (or electroless) coat the entire surface of the layer.
3. Blanket electroplate Cu to fill the imprinted features, cover the entire layer with Cu
4. Grind off the Cu down to the top surface of the original soft material.

FIG. 2A is a flow chart of method 200. Refer to FIGS. 1A and 1B for structural details. At block 210, the substrate 110 is imprinted (embossed) with a pattern of channels. At block 220, a relatively thin conductive layer 115 is deposited by, for example, sputtering a conductor such as copper or nickel or other suitable metal, or electrolessly depositing layer 115 such as nickel or copper formed by, for example, by dipping substrate 110 in a bath of a suitable nickel or copper salt. At block 230, the entire surface of conductive layer 115 is plated with a thickness of metal sufficient to leave appropriate dimensions to the traces after the grinding/polishing operation of block 240, after which the method is complete at block 299.

Some of the difficulties that arise in method 200 are that the polishing (or grinding) can proceed unevenly, particularly when performed on a large substrate (such as would typically be later divided into a plurality of individual packages, for example, starting substrates can be as large as about 50 cm. by 50 cm., or larger). Even if polishing is evenly performed across the entire substrate, overpolishing of the metal (i.e., excess material removal) results in traces that are too thin, while underpolishing of the metal (i.e., insufficient material removal) results in shorts between traces. Uneven polishing can result from variations in the substrate thickness or stiffness, or variations in the embossing surface or pressure applied during embossing. Thus the resulting traces can vary in thickness and conductivity. Grinding can also result in a rough grooved surface on the traces making later connections difficult, costly, or unreliable.

The above imprinting process requires a suitable planarization process to remove the overplated copper. Etching, grinding, and CMP (chemical-mechanical polishing) have been investigated, but are difficult.

Figure 2B:
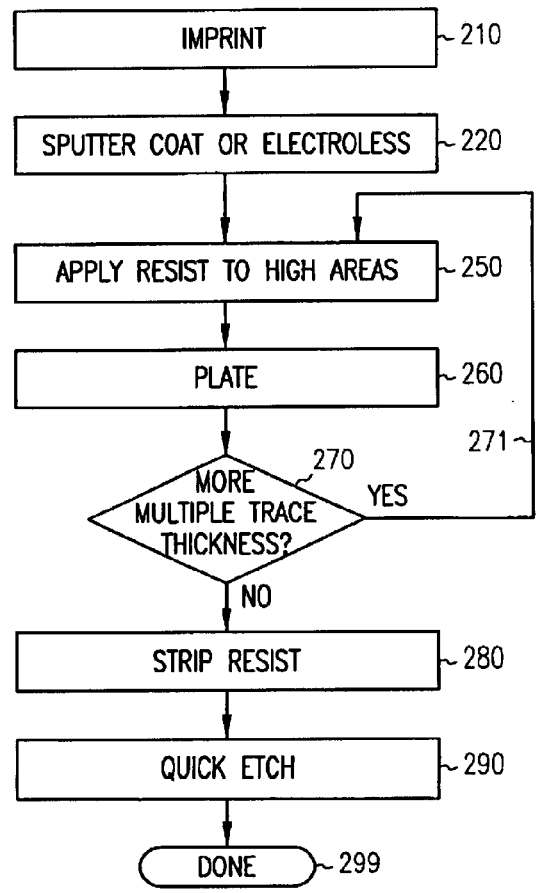
FIG. 2B is a flow chart of method 201.
Figure 5:
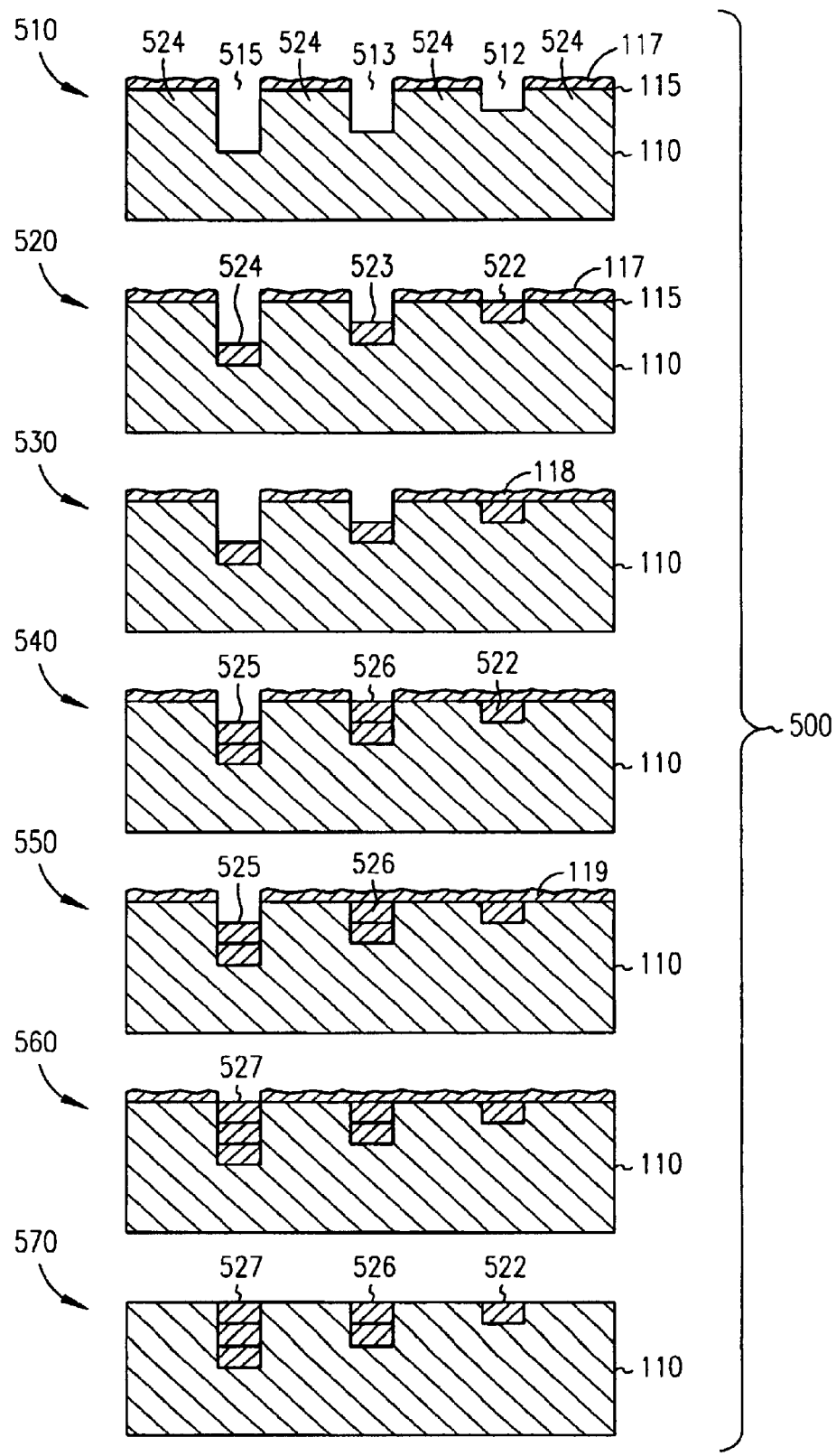
FIG. 5 is a flow chart showing cross section views during method 500.

FIG. 2B is a flow chart of an improved method 201, according to one embodiment of the present invention. Blocks 210 and 220 are substantially the same as in FIG. 2A. At block 250, a layer 117 of resist or other suitable electrically insulating material is deposited, but only on the high (ridge) areas 114 of the surface of conductive layer 115. This limits subsequent plating of block 260 (for example, by wet-chemical electroplating wherein layer 115 is one electrode) to occur only within the channels 112, where the conductive layer 115 is not coated with insulating layer 115. See result 340 of FIG. 3. In some embodiments, two or more different channel depths are formed (such as by embossing using a master that has different-height ridges). If this is the case, then at block 270, the shallowest channels will be filled with plating material forming traces 322, and a loop back to block 250 is taken, wherein more resist is applied to cover these metal-filled shallow channels while leaving the deeper channels exposed for further plating. Once all the channels 112 are plated substantially full with the plating metal, the traces 322 are complete, and the method passes to block 280, where the insulating layer 117 (and, in some embodiments, 118 and 119, as shown in FIG. 5 and described below) is stripped off (such as by a suitable solvent). At block 290, a quick etch operation is performed to remove the exposed conductive layer 115, leaving only traces 322 embedded in substrate 110.

Various embodiments of the invention avoid the overplating of method 200, and thereby eliminate the need for any bulk Cu removal process. The method 200 process is extremely challenging, in part because any warpage or thickness nonuniformity of the substrate can cause too much material to be removed in some areas and too little to be removed in others. The result is non-uniform, out of spec, or missing features.

Furthermore, embodiments of the invention eliminate the considerable amount of Cu wasted by the "subtractive" process of FIGS. 1A, 1B and 2A. The lengthy copper electroplating time is greatly reduced. These embodiments significantly reduce the overall substrate manufacturing time by replacing the bulk copper removal process with a very quick etch process and by reducing by more than 50% the time required for copper plating.

Figure 3:
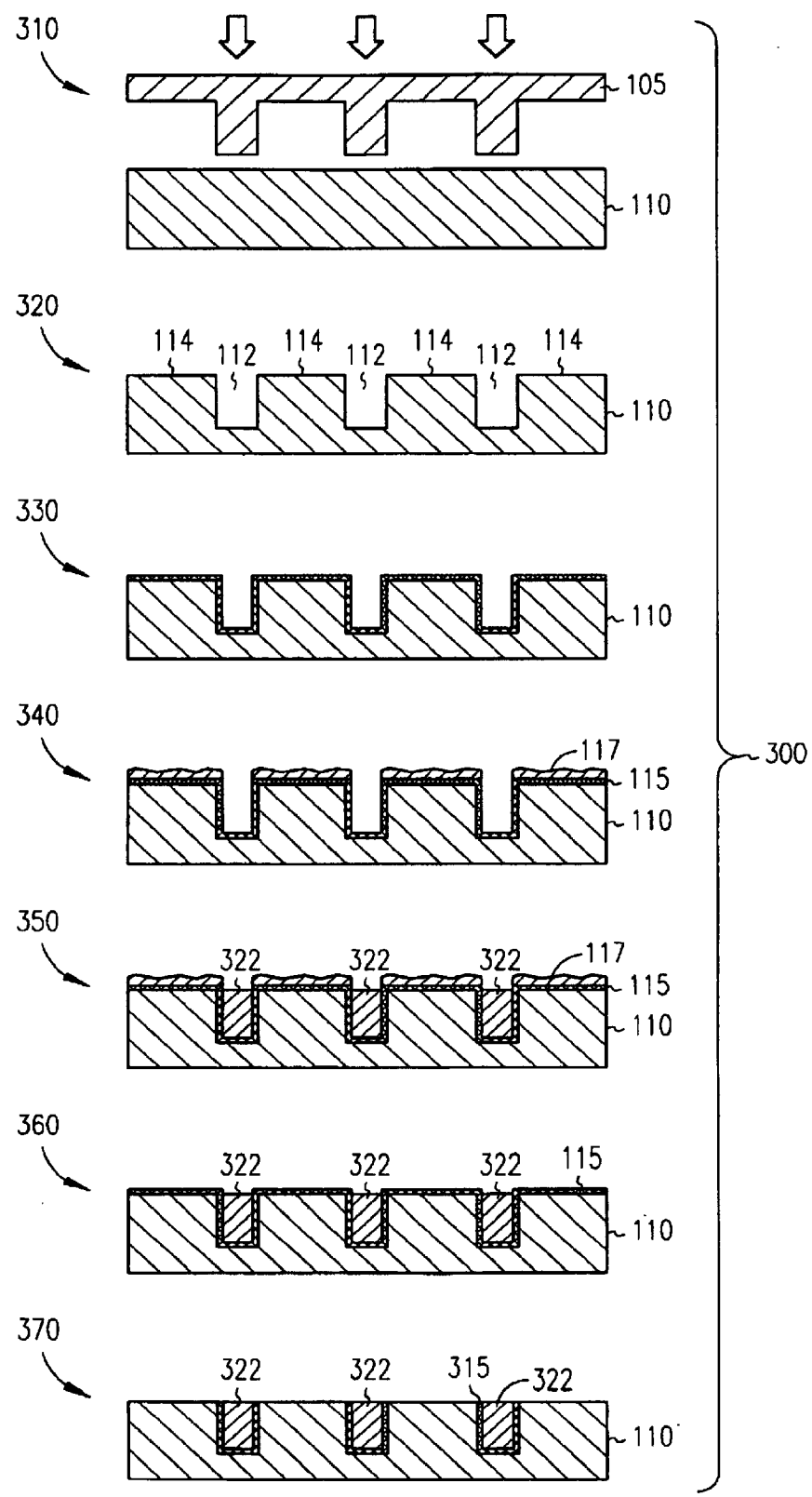
FIG. 3 is a flow chart showing cross section views during method 300.

FIG. 3 is a flow chart showing cross section views during method 300. At 310 an embossing surface 105 is pressed against starting substrate 110. In some embodiments, substrate 110 includes an electrically and/or thermally conductive metal sheet 111 covered with a plastic layer 113 as shown in FIG. 1B. In other embodiments, a sheet made only of plastic is used for substrate 110. In yet other embodiments, a liquid material such as plastic is applied to embossing surface 105, then hardened or solidified to form substrate 110, and then peeled away or otherwise removed. Intermediate result 320 shows the resulting imprinted layer of substrate 110 having a plurality of recessed channels after embossing of block 210 of FIG. 2B. Intermediate result 330 shows the resulting coated layer after the sputtering or electroless depositing of conductive layer 115 on imprinted substrate 110. Because conductive layer 115 covers both the channels and the raised areas, a single electrical connection makes layer 115 an electrode that allows plating to all the exposed channel areas. Layer 115 can be made of any material suitable for forming a plating electrode. Intermediate result 340 shows the resist 117 applied to all the raised areas 114 (by operation 250 of FIG. 2B), in order to prevent any metal being added to those areas by the plating operation 260. Intermediate result 350 shows the traces 322 having been plated into all the channels 112 by plating operation 260. Intermediate result 360 shows substrate after the resist has been stripped away (for example, by wet chemical processing or plasma removal) by operation 280 of FIG. 2B. Final result 370 shows the electrically isolated traces 322 after the quick etch of operation 290 has removed the exposed conductive layer 115 while substantially leaving the traces 322. In some embodiments, a selective etch is used that preferentially removes the material of layer 115 while substantially not etching the plated material 322.

Figure 4:
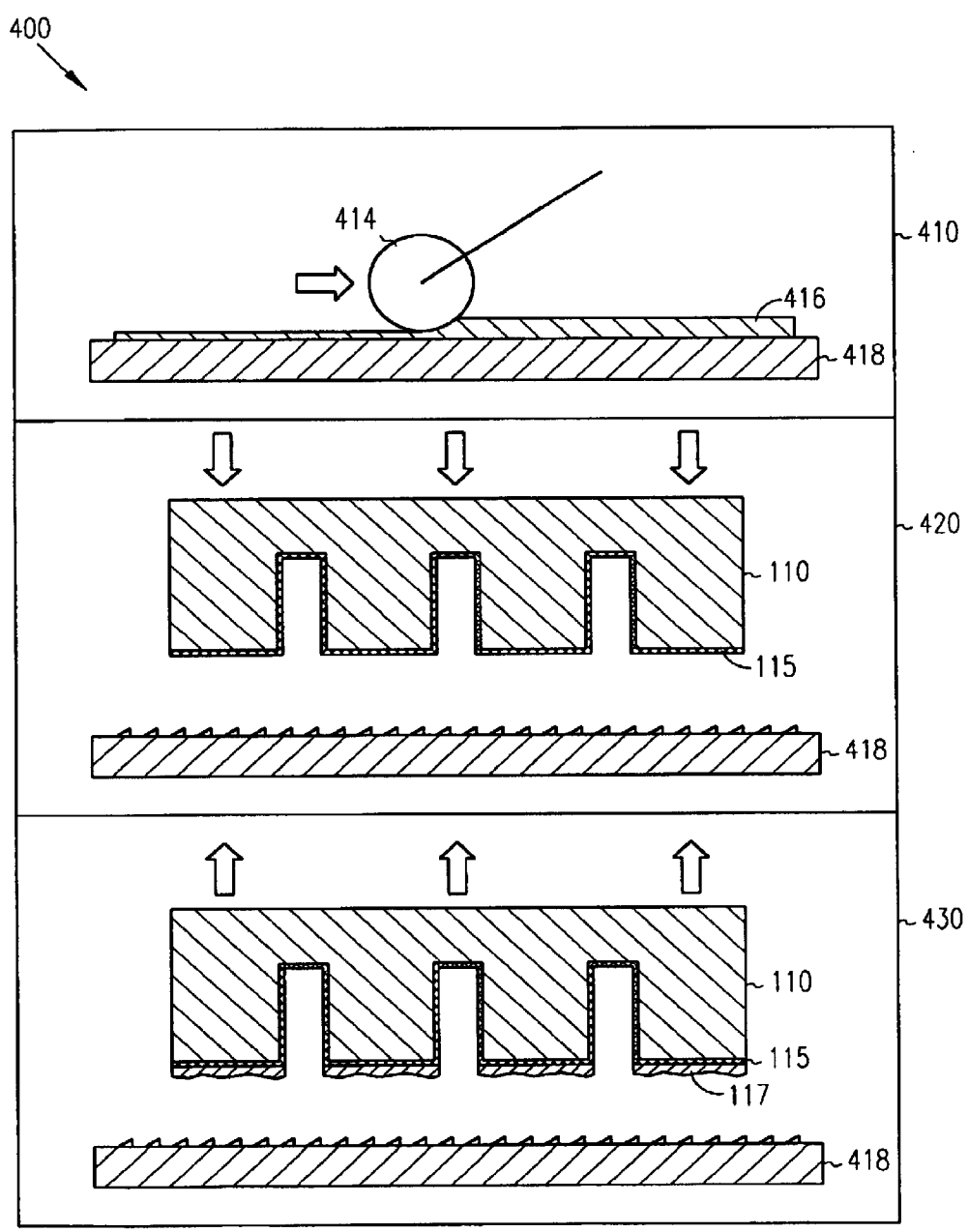
FIG. 4 is a flow chart showing cross section views during method 400.

FIG. 4 is a flow chart showing cross section views during method 400, which is used in some embodiments to apply resist layer 117 for method 201 of FIG. 2B and method 500 of FIG. 5. At block 410, a resist material 416 is applied to a transfer surface of base 418 using a roller 414 in a manner similar to applying ink to a printing platen. At block 420, an embossed substrate 110 having conductive layer 115 is pressed against the coated base 418. At block 430, the substrate 110 is removed with the resist layer 117 sticking to all the raised areas that contacted the resist on base 418. This embodiment provides contact transfer of resist material in the form of liquids, inks, or pastes in a simple process. In some embodiments, rather than rolling the resist as in block 420, the resist is applied and spread by spinning the base 418 to evenly spread the resist.

In other embodiments, the invention employs direct roller-transfer of resist material from a roller to the raised surfaces 114 of the substrate 110.

In other embodiments, a dry film of resist is provided on transfer surface of base 418. Resists used in conventional substrate-manufacturing process allow location-specific electroplating. These resists are typically dry film, but are available in liquid form, which enables the embodiment shown in FIG. 4 to be employed. For the purposes described herein, such resists need not be photosensitive, but in some embodiments, photosensitive resists can be used, although, in some embodiments, the photosensitivity is not used in applying or using such resists as a mask to location-specific plating on an embossed surface.

In other embodiments, a photosensitive resist is used, wherein the resist is deposited on a flat surface having a thin background conductive layer such as nickel or copper under the resist. A mask defines a pattern to be plated, and the resist is developed and removed where traces are to be added by plating. A plating operation adds material, such as copper, to the traces. The resist is then stripped away, and a short etch operation is performed to remove the background layer while leaving substantially all of the plated material.

FIG. 5 is a flow chart showing cross section views during method 500, used for some embodiments of the invention. Method 500 iterates using path 271 of FIG. 2B one or more times. In method 500, an embossing surface is used that has ridges of a plurality of different heights, thus forming a set of shallow channels 512, and one or more sets of deeper channels 513 and optionally even deeper sets of channels 515 into substrate 110. Only one channel of each set is shown, however a plurality of channels would typically be included in each set. Intermediate result 510 shows resist layer 117 applied to all the raised areas 524, leaving conductive layer 115 exposed in all the sets channels 512, 513 and 515. Intermediate result 520 shows a partial plating amount that has filled channels 512 to form thin traces 522, and has partially filled an amount 523 in the set of channels 513, and has partially filled an amount 524 in the set of channels 515. Intermediate result 530 shows that an additional resist layer 118 applied to all the raised areas 524 and to the now-filled channel trade 522, leaving conductive layer 115 exposed in only the sets of channels 513 and 515. Intermediate result 540 shows an additional partial plating amount that has filled channels 513 to form intermediate-thickness traces 526, and has further partially filled to an amount 526 in the set of channels 513, and has partially filled to an amount 525 in the set of channels 515. Intermediate result 550 shows that an additional resist layer 119 applied to all the raised areas 524 and to the now-filled channel trade 526, leaving conductive layer 115 exposed in only the sets of channels 515. Intermediate result 560 shows a final plating amount that has filled channels 515 to form thick traces 527. Final result 570 shows all resist layers 117, 118, and 119 removed, and the conductive layer 115 removed from the raised areas, leaving three sets of conductors 522, 526, and 527, each having a different thickness.

Figure 6:
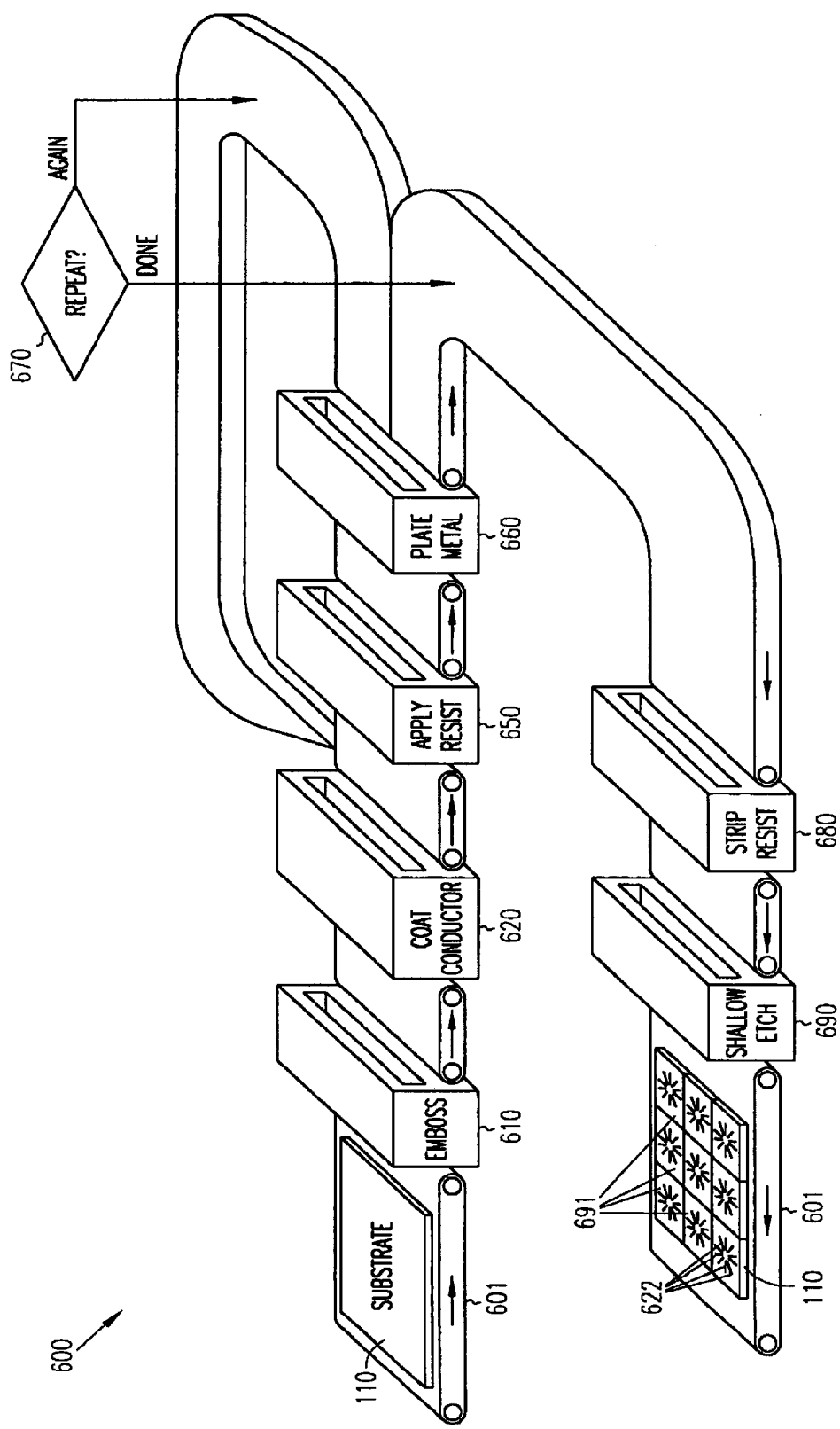
FIG. 6 is a schematic perspective view of a system 600.

FIG. 6 is a schematic perspective view of a system 600. Starting in the upper left, a substrate is conveyed through system 600 by transport mechanism 601. In other embodiments, the substrate 110 is manually taken through the various machines and subsystems. At embosser 610, the substrate 110 (see FIG. 3) is imprinted (embossed) with a pattern of channels. In other embodiments, other mechanisms are used to provide a substrate having indented channels, such as casting or molding that solidifies a liquid starting material on a mold surface to form the desired channel patterns. At coater subsystem 620, a relatively thin conductive layer 115 (see FIG. 3) is deposited by, for example, sputtering a conductor such as copper or nickel or other suitable metal, or electrolessly depositing layer 115 such as nickel formed by, for example, by dipping substrate 110 in a bath of a suitable nickel salt. In some embodiments, a plating operation is performed on the starting layer to form layer 115 used in subsequent operations.

At second coater 650, a layer 117 of resist or other suitable electrically insulating material is deposited, but only on the high (ridge) areas 114 of the surface of conductive layer 115. This limits subsequent plating operation(s) in plater 660 to occur only within the channels 112, where the conductive layer 115 is not coated with insulating layer 115. See result 340 of FIG. 3. In some embodiments, two or more different channel depths are formed as shown and described for FIG. 5 (such as by embossing using a master that has different-height ridges). If this is the case, then as the substrate reaches conveyor fork 670, the shallowest channels will have been filled with plating material forming traces 322, and a loop back to block 650 is taken, wherein more resist is applied to cover these metal-filled shallow channels while leaving the deeper channels exposed for further plating. Once all the channels 112 are plated substantially full with the plating metal, the traces 322 are complete, and the conveyor fork passes the substrate 110 to stripper 680, where the insulating layer 117 (and, in some embodiments, 118 and 119, as shown in FIG. 5 above) is stripped off (such as by a suitable solvent). At etcher 690, a quick etch operation is performed to remove the exposed conductive layer 115, leaving only traces 622 (either all substantially the same thickness like traces 322 of FIG. 3, or of different thicknesses like traces 522, 526, and/or 527 of FIG. 5) embedded in substrate 110. In some embodiments, substrate 110 provides two or more packages 691 that are later separated into individual packages, each having a plurality of traces 622.

Having traces with different thicknesses allows customizing the thickness of each trace to the amount of current, for example, having thicker traces for power supply wiring and thinner traces for signal wiring. Additionally, for embodiments employing a ground plane 111 such as shown in FIG. 1B with an insulating layer 113 that holds the resulting traces, the designer can adjust the spacing between the ground plane and the traces (using deeper or shallower channels), and thereby adjust the transmission-line impedance of the sets of traces.

In some embodiments, the present invention is employed to form traces for a plurality of packages that are simultaneously formed, and later diced or cut apart, to form individual packages. In some embodiments, the packages are used for packaging processors and or chipsets associated with processors.

In some embodiments, one can detect the "seam" in the deeper plated features, created when the plating is stopped and then restarted after coating the filled shallower features with resist. The seam may be either visible or notable by XPS or SIMS characterization. Also, one could look for the absence of the effects of grinding, polishing, or etching, since these will not be required in various embodiments of the invention described.

The technical advantages of various embodiments of the invention are: elimination of the grinding (or etching or CMP) step from the imprinting process flow, a major reduction of time required for copper plating, a major reduction in wasted plated material, better control of feature thickness, since only the plating step must be controlled, instead of both plating and a material removal process, and faster overall substrate manufacturing time.

Conclusion

As exemplified in FIG. 2B, some embodiments of the present invention provide a method 201 for making a conductive circuit on a substantially non-conductive substrate. This method includes forming 210 a plurality of indented channels on a major surface of the substrate, coating 220 the surface with a first conductive layer, selectively coating 250 portions of the surface other than the indented channels with a non-conductive layer, plating 260 additional conductive material on the first conductive layer in the channels, and removing 280, 290 the non-conductive layer and the first conductive layer from portions of the surface other than the indented channels.

In some embodiments, the forming a plurality of indented channels includes forming a first set of channels 512 at a first depth and a second set of channels 513 at a second depth. In some such embodiments, the plating additional conductive material includes plating a first amount of additional conductive material in the first set of channels and the second set of channels, selectively coating at least the first set of channels with a non-conductive layer, and plating a second amount of additional conductive material in the second set of channels.

In some embodiments, the forming a plurality of indented channels includes forming a first set of channels 512 at a first depth and a second set of channels 513 at a second depth and a third set of channels 515 at a third depth. Further, the plating additional conductive material includes plating a first amount of additional conductive material in the first set of channels and the second set of channels and the third set of channels, selectively coating over at least the first set of channels with a non-conductive layer, plating a second amount of additional conductive material in the second set of channels and the third set of channels, selectively coating over at least the second set of channels with a non-conductive layer, and plating a third amount of additional conductive material in the third set of channels.

In some embodiments, the forming a plurality of indented channels includes embossing a pattern for the channels into the substrate from a master 105.

In some embodiments, the selectively coating portions of the surface includes rolling a liquid material over the raised portions of the surface, and solidifying the liquid material.

In some embodiments, as shown in FIG. 4, the selectively coating portions of the surface includes pressing 420 the substrate against a transfer surface having a layer of non-conductive material, and separating 430 the substrate from the transfer surface such that portions of the non-conductive material are transferred to the substrate on areas around the channels.

In some embodiments, the removing the non-conductive layer and the first conductive layer includes stripping 280 the non-conductive material, and etching 290 to substantially remove the first conductive layer while substantially not removing the added conductive material in the channels.

In some embodiments, the invention provides a conductive circuit formed on a substantially non-conductive substrate according to embodiments of the method described above.

Some embodiments of the invention provide a system for making a conductive circuit on a substantially non-conductive substrate. This system includes an embosser that forms a plurality of indented channels on a major surface of the substrate, a first coater that coats the surface with a first conductive layer, a second coater that selectively coats portions of the surface other than the indented channels with a non-conductive layer, a plater that plates additional conductive material on the first conductive layer in the channels, and a stripper that removes the non-conductive layer and the first conductive layer from portions of the surface other than the indented channels.

In some embodiments of the system, the embosser includes an embossing surface having a first set of ridges at a first height and a second set of ridges at a second height.

In some embodiments, the plater is configured to plate a first amount of additional conductive material in the first set of channels and the second set of channels, the second coater is configured to then selectively coat at least the first set of channels with a non-conductive layer, and the plater is configured to then plate a second amount of additional conductive material in the second set of channels.

In some embodiments, the embosser includes an embossing surface having a first set of ridges at a first height and a second set of ridges at a second height and a third set of ridges at a third height.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for making a conductive circuit on a substantially non-conductive substrate, the method comprising:
   providing a substrate having a plurality of indented channels on a major surface of the substrate, the major surface coated with a first conductive layer;
   selectively coating portions of the surface other than the indented channels with a non-conductive layer, wherein selectively coating portions of the surface includes
   rolling a liquid material over a transfer surface;
   pressing the major surface of the substrate against the transfer surface; and
   solidifying the liquid material;
   plating additional conductive material on the first conductive layer in the channels; and
   removing the non-conductive layer and the first conductive layer from portions of the surface other than the indented channels.

2. The method according to claim 1, wherein the providing the substrate includes forming a plurality of indented channels on a major surface of the substrate; and coating the major surface with the first conductive layer.

3. The method according to claim 2, wherein the operations are performed in the order listed.

4. The method according to claim 2, wherein the forming a plurality of indented channels includes
   forming a first set of channels at a first depth and a second set of channels at a second depth.

5. The method according to claim 4, wherein the plating additional conductive material includes:
   plating a first amount of additional conductive material in the first set of channels and the second set of channels;
   selectively coating at least the first set of channels with a non-conductive layer; and
   plating a second amount of additional conductive material in the second set of channels.

6. The method according to claim 2, wherein the forming a plurality of indented channels includes:
   forming a first set of channels at a first depth and a second set of channels at a second depth and a third set of channels at a third depth; and wherein the plating additional conductive material includes
   plating a first amount of additional conductive material in the first set of channels and the second set of channels and the third set of channels;
   selectively coating over at least the first set of channels with a non-conductive layer;
   plating a second amount of additional conductive material in the second set of channels and the third set of channels;
   selectively coating over at least the second set of channels with a non-conductive layer; and
   plating a third amount of additional conductive material in the third set of channels.

7. The method according to claim 2, wherein the forming a plurality of indented channels includes
   embossing a pattern for the channels into the substrate from a master.

8. The method according to claim 1, wherein the removing the non-conductive layer and the first conductive layer includes stripping the non-conductive material; and etching to substantially remove the first conductive layer while substantially not removing the added conductive material in the channels.

9. A method for making a conductive circuit on a substantially non-conductive substrate, the method comprising:
   providing a substrate having a plurality of indented channels on a major surface of the substrate, the major surface coated with a first conductive layer;
   selectively coating portions of the surface other than the indented channels with a non-conductive layer, wherein selectively coating portions of the surface includes
   rolling a liquid material over the major surface; and
   solidifying the liquid materials;
   plating additional conductive material on the first conductive layer in the channels; and
   removing the non-conductive layer and the first conductive layer from portions of the surface other than the indented channels.

10. A method for making a conductive circuit on a substantially non-conductive substrate, the method comprising:
    providing a substrate having a plurality of indented channels on a major surface of the substrate, the major surface coated with a first conductive layer;
    selectively coating portions of the surface other than the indented channels with a non-conductive layer, wherein selectively coating portions of the surface includes
    pressing the substrate against a transfer surface having a layer of non-conductive material; and
    separating the substrate from the transfer surface such that portions of the non-conductive material are transferred to the substrate on areas around the channels;
    plating additional conductive material on the first conductive layer in the channels; and
    removing the non-conductive layer and the first conductive layer from portions of the surface other than the indented channels.

11. A system for making a conductive circuit on a substantially non-conductive substrate, the system comprising:
    an embosser that forms a plurality of indented channels on a major surface of the substrate, wherein the embosser includes an embossing surface having a first set of ridges to form a first set of channels at a first height and a second set of ridges to form a second set of channels at a second height;
    a first coater that coats the surface with a first conductive layer;
    a second coater that selectively coats portions of the surface other than the indented channels with a non-conductive layer;

a plater that plates additional conductive material on the first conductive layer in the channels; and a stripper that removes the non-conductive layer and the first conductive layer from portions of the surface other than the indented channels.

12. The system according to claim 11, wherein the plater is configured to plate a first amount of additional conductive material in the first set of channels and the second set of channels, the second coater is configured to then selectively coat at least the first set of channels with a non-conductive layer, and the plater is configured to then plate a second amount of additional conductive material in the second set of channels.

13. The system according to claim 11, wherein the embossing surface further includes a third set of ridges at a third height.

14. A system for making a conductive circuit on a substantially non-conductive substrate, the system comprising:

means for forming a plurality of indented channels on a major surface of the substrate;

means for coating the surface with a first conductive layer;

means for selectively coating portions of the surface other than the indented channels with a non-conductive layer, wherein the means for selectively coating portions of the surface other than the indented channels with the non-conductive layer transfer a thin layer of resist on raised portions of the surface by contacting the surface with a resist-coated surface;

means for plating additional conductive material on the first conductive layer in the indented channels, wherein the means for plating include electroplating apparatus for depositing a metal in the indented channels; and means for removing the non-conductive layer and the first conductive layer from portions of the surface other than the indented channels.

15. A system for making a conductive circuit on a substantially non-conductive substrate, the system comprising:

means for forming a plurality of indented channels on a major surface of the substrate;

means for coating the surface with a first conductive layer;

means for selectively coating portions of the surface other than the indented channels with a non-conductive layer;

means for plating additionl conductive material on the first conductive layer in the channels;

means for remoing the non-coductive layer and the first conductive layer from portions of the surface other the indented channls;

means for selectively coating additional portions of the surface over some but not all of the indented channls with a non-coductive layer; and means for plating additional conductive material on the uncoated channels.

\* \* \* \* \*